(12) United States Patent
Hashimoto

(10) Patent No.: US 7,209,015 B2
(45) Date of Patent: Apr. 24, 2007

(54) OSCILLATOR CIRCUIT HAVING A TEMPERATURE DEPENDENCE

(75) Inventor: Takeshi Hashimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 60 days.

(21) Appl. No.: 11/088,808

(22) Filed: Mar. 25, 2005

(65) Prior Publication Data
US 2005/0212613 A1  Sep. 29, 2005

(30) Foreign Application Priority Data
Mar. 26, 2004  (JP)  ............... 2004-091837

(51) Int. Cl.
H03L 1/00  (2006.01)

(52) U.S. Cl. ............ 331/176; 331/49; 331/56; 327/101; 327/512

(58) Field of Classification Search ........ 331/176, 331/49, 56; 327/101, 512
See application file for complete search history.

(56) References Cited

U.S. PATENT DOCUMENTS 5,604,468 A * 2/1997 Gillig ................. 331/176
5,856,766 A * 1/1999 Gillig et al. ........... 331/176
6,326,850 B1 * 12/2001 Casagrande ............. 331/17

FOREIGN PATENT DOCUMENTS

JP  2003-100074 A  4/2003

* cited by examiner

Primary Examiner—Robert Pascal
Assistant Examiner—Levi Gannon
(74) Attorney, Agent, or Firm—Foley & Lardner LLP

(57) ABSTRACT

An oscillator circuit includes a current source for generating a current depending on the ambient temperature, a plurality of oscillators for oscillating at respective periods depending on the current from the current source and based on different relations between the ambient temperature and the periods, and a frequency demultiplication unit for receiving an output signal from one of the oscillators selected by a period selecting circuit 103. The frequency dividing ratio of the frequency demultiplication circuit is set so that a higher ambient temperature provides a smaller frequency dividing ratio.

8 Claims, 13 Drawing Sheets

BIAS CIRCUIT

LEVEL CONVERTER

OSCILLATOR CIRCUIT HAVING A TEMPERATURE DEPENDENCE

BACKGROUND OF THE INVENTION

1. Field of the Invention

The present invention relates to an oscillator circuit having a temperature dependence, and more particularly, to an oscillator circuit that changes the period of an output signal depending on on the ambient temperature.

2. Description of Related Art

Recently, portable devices such as notebook-size personal computers are provided with a DRAM (Dynamic Random Access Memory) of large capacity so as to store therein a large amount of process data. In a DRAM, since the data retained by respective memory cells are being lost as time elapses, it is necessary to refresh the DRAM before the retained data are lost.

In a DRAM, due to an operating current at the time of refresh operation, a battery working as a power supply source is consumed. Generally, data retention property of a memory cell has a temperature dependency. That is, a lower chip temperature increases the data retention period, thereby raising the data retention capability of the DRAM. Furthermore, the chip temperature of a DRAM changes depending on the operational state of the DRAM itself, and the DRAM chip temperature is higher at the time of normal operation and is lower at the time of data retention. Accordingly, it is desired that the period of time between the time instant at which the refresh operation is carried out and the time instant at which the next refresh operation is carried out (refresh period) be elongated when the chip temperature is lower at the time of data retention. This is aimed to reduce the number of times of the refresh operation carried out during a predetermined period of time to lower the power dissipation of the DRAM caused by the refresh operation. Especially, the lower power dissipation is strongly required for portable devices provided with a DRAM. Therefore, it is strongly required that the power dissipation due to the refresh operations of a DRAM be lowered.

As a technique to change the refresh period depending on the ambient temperature, there is a known technique described in Jpn. Pat. Appln. Laid-Open Publication No. 2003-100074. Generally, in the technique generating the refresh period which changes depending on the ambient temperature, an oscillator circuit is used. As methods for changing the refresh period by using an oscillator circuit, there are known two types: a digital system and an analog system. Under the digital system, a frequency demultiplication circuit or a frequency divider is used which divides the frequency of an output signal from an oscillator circuit that outputs a signal of a constant period, and the frequency dividing ratio is changed based on the ambient temperature. Under the analog system, the period itself of an output signal from an oscillator circuit is controlled in the analog manner depending on the ambient temperature.

FIG. 13A shows a block diagram of a refresh period generation circuit 200 of digital system as described above, whereas FIG. 13B shows a graphical representation indicative of the relation between the period of an output signal of the refresh period generation circuit 200 and the ambient temperature. In FIG. 13B, graph (A) indicates required refresh period property refresh period performance), and graph (B) indicates the refresh period that the refresh period generation circuit 200 generates. An oscillator 202 oscillates at a constant period (fundamental period) without depending on the temperature change based on a constant current generated by a constant current source 201 having a property of no temperature dependency. A frequency demultiplication circuit 203 divides the frequency of an output signal from the oscillator 202 by a frequency dividing ratio determined based on the ambient temperature (chip temperature) that a temperature sensor 204 detects, and outputs a refresh period signal SigREF.

The refresh period required in a DRAM is generally inversely proportional to the ambient temperature, as shown by graph (A) in FIG. 13B. In the refresh period generation circuit 200, the frequency demultiplication circuit 203 sets the frequency dividing ratio at "1" (no frequency demultiplication) when the chip temperature sensed by the temperature sensor 204 is between 105° C. and 85° C., and outputs an output signal from the oscillator 202, that oscillates at the fundamental period T0, as a refresh period signal without changing the period, as shown by graph (B). The frequency demultiplication circuit 203 increases the frequency dividing ratio as the sensed chip temperature falls, and outputs refresh period signals specifying periods, which are two times, four times etc. the fundamental period by setting the frequency dividing ratio at "2", "4". . . . With the refresh period generation circuit 200 of digital system, a refresh period having a large magnification ratio to the fundamental period of the oscillator 202 can be obtained, and a refresh period signal SigREF specifying a period close to a required refresh period can be obtained.

FIG. 14A shows a block diagram of a refresh period generation circuit 200a of analog system, whereas FIG. 14B shows a graphical representation indicative of the relation between the period of an output signal of the refresh period generation circuit 200a and the ambient temperature. A current source 201a is so configured as to be able to increase or decrease the output current value depending on the ambient temperature. An oscillator 202a oscillates at a period depending on the ambient temperature based on the current generated by the current source 201a having the temperature dependency. A frequency demultiplication circuit 203a divides the frequency of an output signal from the oscillator 202a by a constant frequency dividing ratio, and outputs a refresh period signal SigREF. Employing this configuration, the refresh period generation circuit 200a of analog system outputs a refresh period that increases linearly as the ambient temperature falls, as shown by graph (B) in FIG. 14B.

In the refresh period generation circuit 200 of digital system, if the chip temperature sensed by the temperature sensor 204 fluctuates around the switching temperature for switching the frequency dividing ratio of the frequency demultiplication circuit 203, there is raised a problem that the period of the refresh period signal output from the frequency demultiplication circuit 203 largely fluctuates. Accordingly, the temperature sensor 204 is required to sense temperature with a higher accuracy.

For example, when the chip temperature is actually 50° C. and the temperature sensor 204 recognizes the chip temperature to be 45° C. or lower, the refresh period becomes eight times the fundamental period T0. As a result, the difference between the graph (A) and the graph (B) becomes small, as shown by a dotted line in FIG. 13B, and there is raised a problem that margin for the required refresh period becomes small. Conversely, when the chip temperature is actually 45° C. and the temperature sensor 204 recognizes the chip temperature to be 50° C., the refresh period becomes four times the fundamental period T0. As a result, the refresh period becomes unnecessarily short, thereby raising a problem of increased power dissipation.

On the other hand, in the refresh period generation circuit 200a of analog system, since the refresh period is changed in the analog manner in accordance with rise and fall of the current value of the current source 201a, even if the sensed temperature actually fluctuates, the refresh period does not sufficiently match the fluctuation of the sensed temperature, which situation is different from that employing the digital system. Accordingly, in the analog system, if it is desired that the refresh period be changed significantly, it is necessary to change the current value of the current source 201a widely. In this case, if the current value at a high temperature is set low so as to suppress the power dissipation of the oscillator 202a at the high temperature, the current value is excessively reduced at a lower temperature, thereby destabilizing the operation of the oscillator 202 at the lower temperature. Conversely, if the current value at a low temperature is set higher so as to secure the effective operation at the low temperature, there is raised a problem that the power dissipation is increased at a higher temperature. Thus, when employing the analog system, actually, the refresh period cannot be effectively changed, and the change ratio of the refresh period of the analog system is generally suppressed to approximately several times at a maximum. Accordingly, in the analog system, when the chip temperature is low, there is raised a problem that a large difference is caused between the required refresh period (graph (A) in FIG. 14B) and the refresh period specified by the refresh period signal SigREF (graph (B)) output from the frequency demultiplication circuit 203a.

SUMMARY OF THE INVENTION

It is therefore an object of the present invention to overcome the above-mentioned drawbacks by providing an oscillator circuit that generates a refresh period signal specifying a period depending on the sensed temperature, and that can reduce fluctuation of the refresh period along with fluctuation of the sensed temperature, and enlarge the difference between the period generated at a higher temperature and the period generated at a low temperature.

The present invention provides an oscillator circuit including an oscillation unit that oscillates at a period depending on an ambient temperature, a temperature sensor that detects the ambient temperature, and a frequency demultiplication circuit that divides a frequency of an output signal from the oscillation unit by a frequency dividing ratio selected from a plurality of frequency dividing ratios, wherein the frequency demultiplication circuit selects a smaller one of the frequency dividing ratios for a higher ambient temperature being detected by the temperature sensor.

According to the oscillator circuit of the present invention, a higher ambient temperature sensed by the temperature sensor reduces the frequency dividing ratio selected by the frequency demultiplication circuit, with a result that the period of an output signal therefrom is reduced as the ambient temperature increases. Thus, the period of the output signal can be effectively changed in accordance with the change of the ambient temperature. Furthermore, since the oscillation period of the oscillation circuit changes depending on the change of the ambient temperature, even if the temperature detected by the temperature sensor fluctuates, fluctuation of the period of the output signal can be reduced as compared with the case in which the oscillation circuit does not change the period based on the ambient temperature.

In the oscillator circuit of the present invention, the frequency multiplication circuit multiplies the oscillation period of the oscillation unit, which changes depending on the ambient temperature, by a frequency dividing ratio that is determined by the ambient temperature sensed by the temperature sensor. Thus, a large difference can be obtained between the period of an output signal from the oscillator circuit at a lower ambient temperature and the period of the output signal from the oscillator circuit at a higher ambient temperature.

It is preferable in the present invention that the oscillation unit include a current source for generating a current that increases upon a rise of the ambient temperature, a plurality of oscillators for oscillating at respective periods, which depend on a current generated by the current source, and based on different relations between the ambient temperature and the oscillation periods, and an oscillator selection unit that selects one of the plurality of oscillators depending on a detected ambient temperature detected by the temperature sensor.

In the above preferred case, use of the oscillator selection unit to switch the plurality of oscillators are switched allows relation between the period of a signal output from the oscillation unit and the ambient temperature be controlled as desired.

It is also preferable in the present invention that the oscillator circuit further include a temperature range detection unit for detecting a temperature range among a plurality of temperature ranges based on the detected ambient temperature, wherein the selection of the frequency dividing ratio by the frequency demultiplication circuit and the selection of the oscillator by the oscillator selection unit are controlled depending on a temperature range detected by the temperature range detection unit.

In the above preferred case, the simultaneous control of the selection of the frequency dividing ratio by using the frequency demultiplication circuit and the selection of the oscillator by using the oscillator selection unit depending on the temperature ranges allows the period of an output signal from the oscillator circuit to be set at a desired value.

It is also preferable in the present invention that the oscillation unit include a plurality of current sources for generating currents, which increase upon a rise of the ambient temperature, based on different relations between the ambient temperature and values of the currents, a current source selection unit that selects one of the plurality of current sources depending on a detected ambient temperature detected by the temperature sensor, and an oscillator that oscillates at a period depending on a current of the one of the current sources selected by the current source selection unit.

In the above preferred case, the switching of the plurality of current sources by the current source selection unit to supply a current to the oscillator allows the relation between the oscillation period and the ambient temperature to be controlled to a desired relation without providing a plurality of oscillators having different relations between the oscillation frequency and the ambient temperature.

It is also preferable in the present invention that the oscillator circuit further include a level detection unit for detecting a temperature level among a plurality of temperature levels based on the detected ambient temperature, wherein the selection of the frequency dividing ratio by the frequency demultiplication circuit and the selection of the current source by the current source selection unit are controlled depending on a temperature range detected by the temperature range detection unit.

In the above preferred case, the simultaneous control of the selection of the frequency dividing ratio by using the frequency demultiplication circuit and the selection of the current source by using the current source selection unit depending on the temperature ranges allows the period of an output signal from the oscillator circuit to be set at a desired value.

It is also preferable in the present invention that, assuming that a change ratio of the output period of the oscillation unit within one of the temperature ranges is N, the frequency dividing ratio within the one of the temperature ranges correspond to 1/N times the frequency dividing ratio within an adjacent lower temperature range.

In the above preferred case, it is assumed here that in each of the respective temperature ranges, the period of an output signal from the oscillation unit at the highest temperature within the temperature range is T0 (fundamental period) and the period of an output signal from the oscillation unit at the lowest temperature within the temperature range is 2×T0 (with the change ratio of the period being at "2" in the temperature range). The frequency dividing ratio within the temperature range may be set at "4" by setting the frequency dividing ratio in an adjacent lower temperature range at "8" and by setting the frequency dividing ratio at an adjacent higher temperature range at "2", for the purpose of suppressing a steep change in the profile of the period in an output signal from the oscillator circuit around the boundary between the temperature ranges.

BRIEF DESCRIPTION OF THE DRAWINGS

FIG. 2A shows a circuit diagram of a bias circuit that is used in respective circuits within the oscillator circuit, whereas

FIG. 13A shows a block diagram of a conventional refresh period generation circuit of digital system, whereas FIG. 14A shows a block diagram of a conventional refresh period generation circuit of analog system, whereas

DETAILED DESCRIPTION OF THE PREFERRED EMBODIMENTS

Figure 1:
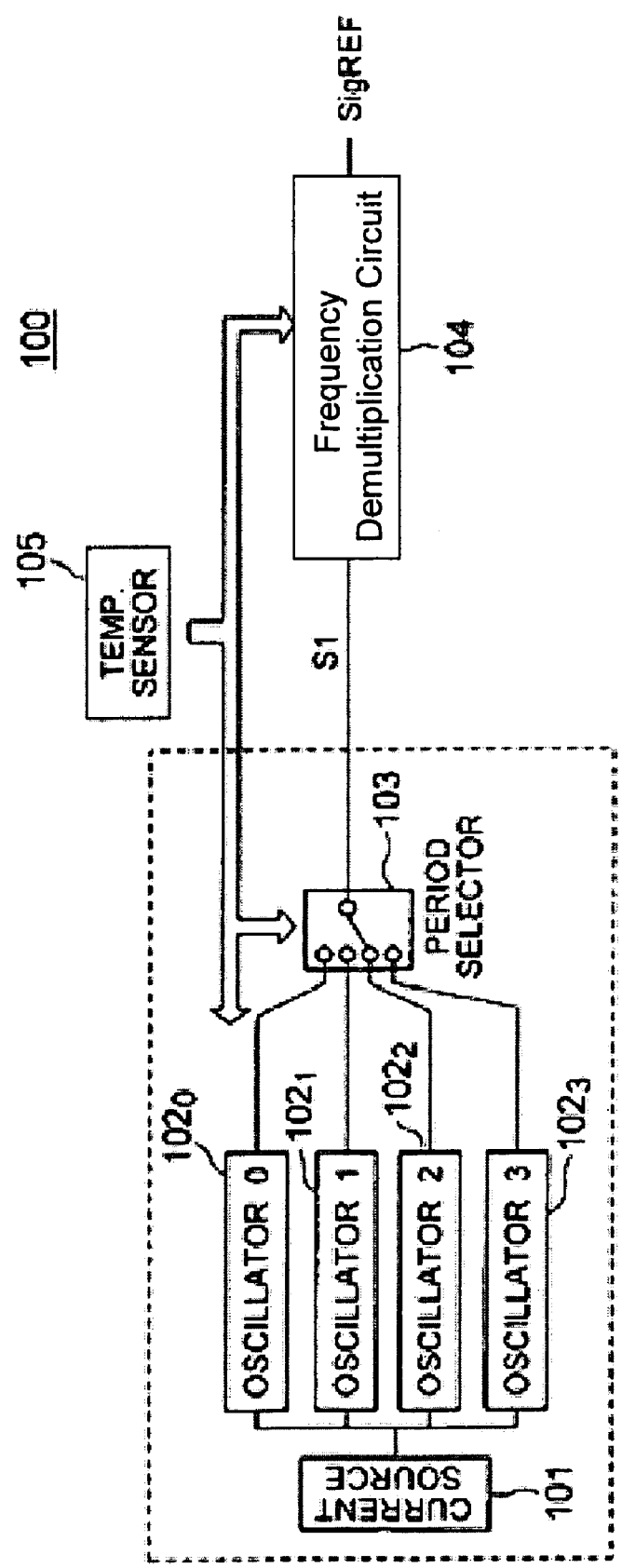
FIG. 1 shows a block diagram of an oscillator circuit according to a first embodiment of the present invention.

The oscillator circuit according to the present invention will further be described below with reference to the accompanying drawings. FIG. 1 shows a block diagram of an oscillator circuit 100 according to a first embodiment of the present invention. As shown in FIG. 1, the oscillator circuit 100 includes a current source 101, oscillators $102_0$ to $102_3$, a period selecting circuit (oscillator selection unit) 103, a frequency demultiplication circuit 104, and a temperature sensor 105. The current source 101, oscillators $102_0$ to $102_3$, and period selecting circuit 103 in combination configure an oscillation unit. The oscillator circuit 100 may be mounted together with DRAM memory cells on a chip on which a general-purpose DRAM, a pseudo-SRAM, or a system LSI is arranged.

The current source 101 delivers a current having a current value depending on the ambient temperature. Specifically, a lower temperature provides a lower output current delivered from the current source 101. Each of the oscillators 102 outputs a signal having a period which monotonously increases in accordance with the current value of the current source 101 along with the fall of the ambient temperature. The relation between the oscillation period of each of the oscillators 102 and the ambient temperature is different from another of the oscillators 102. The temperature sensor 105 detects the ambient temperature (chip temperature). The ambient temperature detected by the temperature sensor is separated into a plurality of temperature ranges, and the oscillators 102 are controlled so that one of the oscillators 102 is started in accordance with a corresponding temperature range based on the ambient temperature detected by temperature sensor 105.

The period selecting circuit 103 selects one of the oscillators 102, which is started among the plurality of oscillators 102, based on the ambient temperature sensed by the temperature sensor 105, and outputs an output signal from the thus selected oscillator 102 as an output signal S1. The frequency demultiplication circuit (period multiplication counter) 104 divides the frequency of the output signal S1 of the period selecting circuit 103 by a frequency dividing ratio determined based on the ambient temperature sensed by the temperature sensor 105, and outputs a refresh period signal SigREF specifying a period which is the product of the frequency dividing ratio and the period of the output signal S1.

Figure 2A:
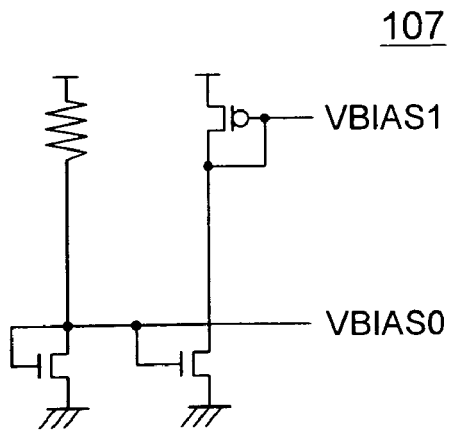
Figure 2B:
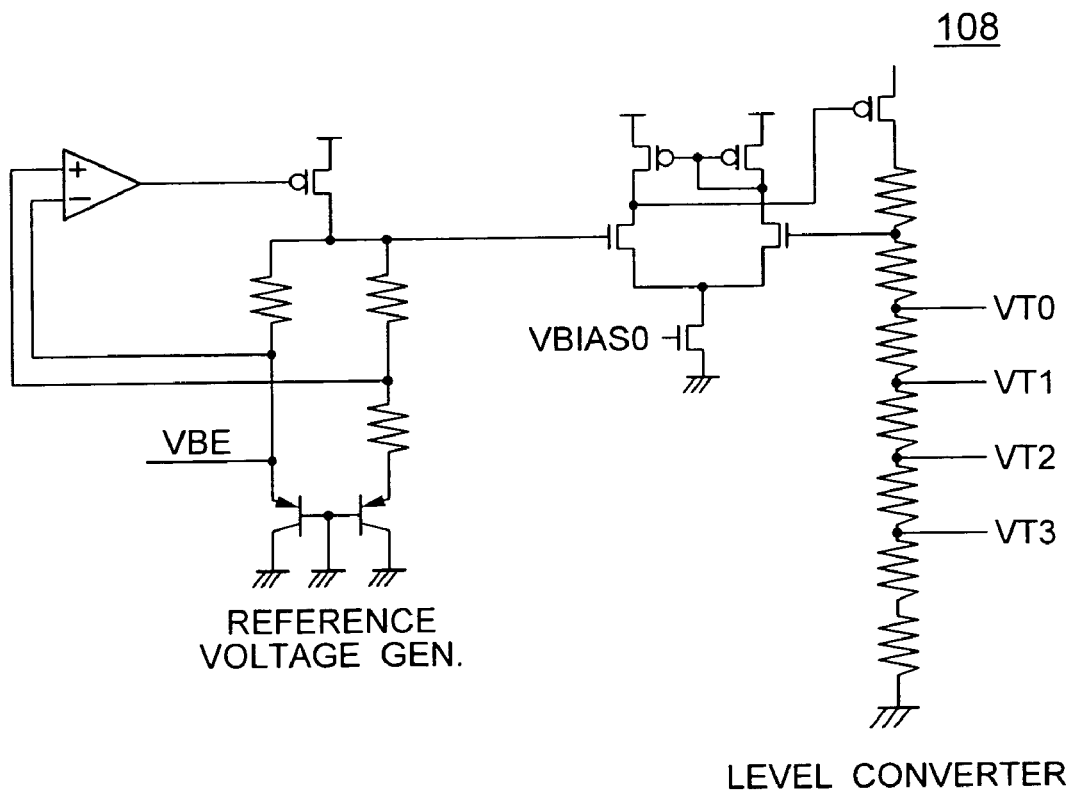
FIG. 2B shows a circuit diagram of a reference voltage generation circuit including a level conversion circuit.
Figure 3:
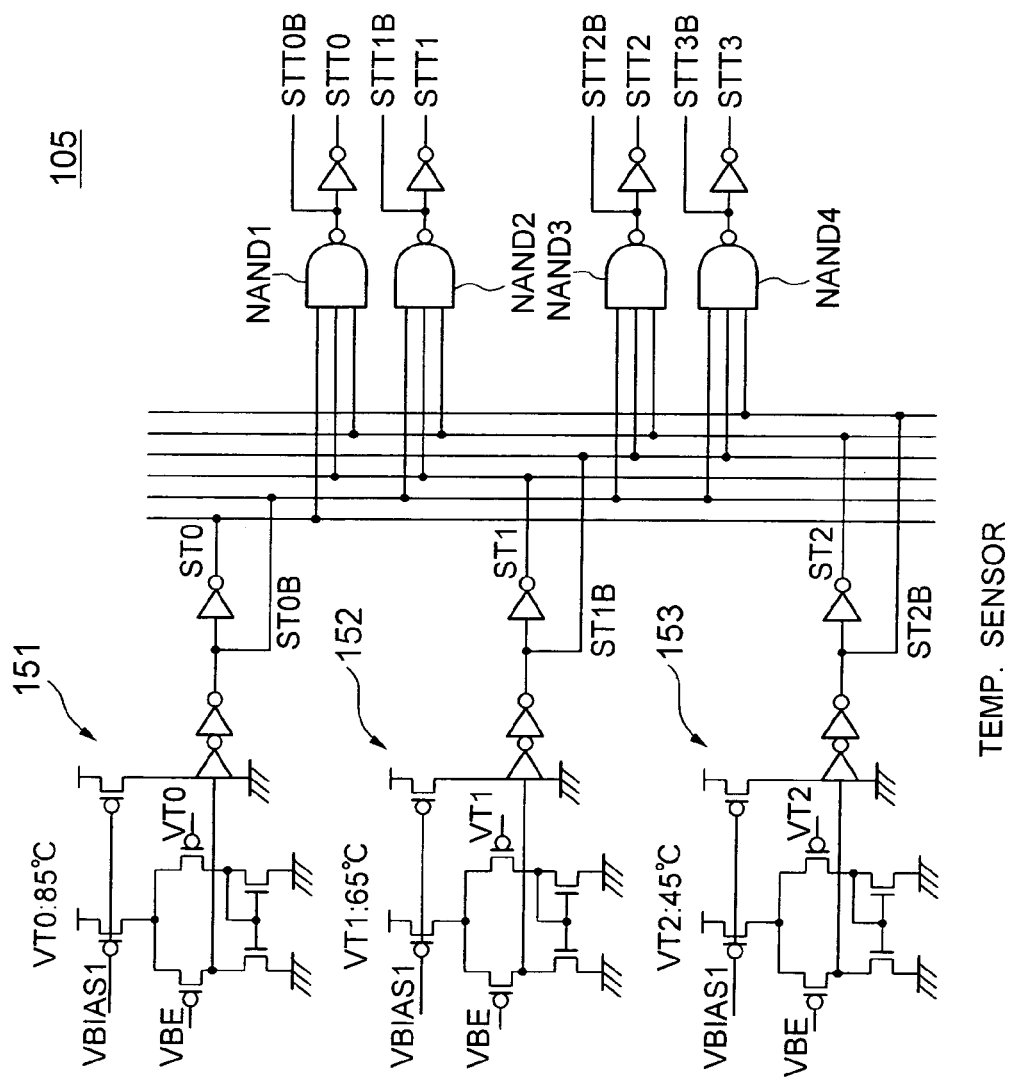
FIG. 3 shows a circuit diagram of a temperature sensor.
Figure 4:
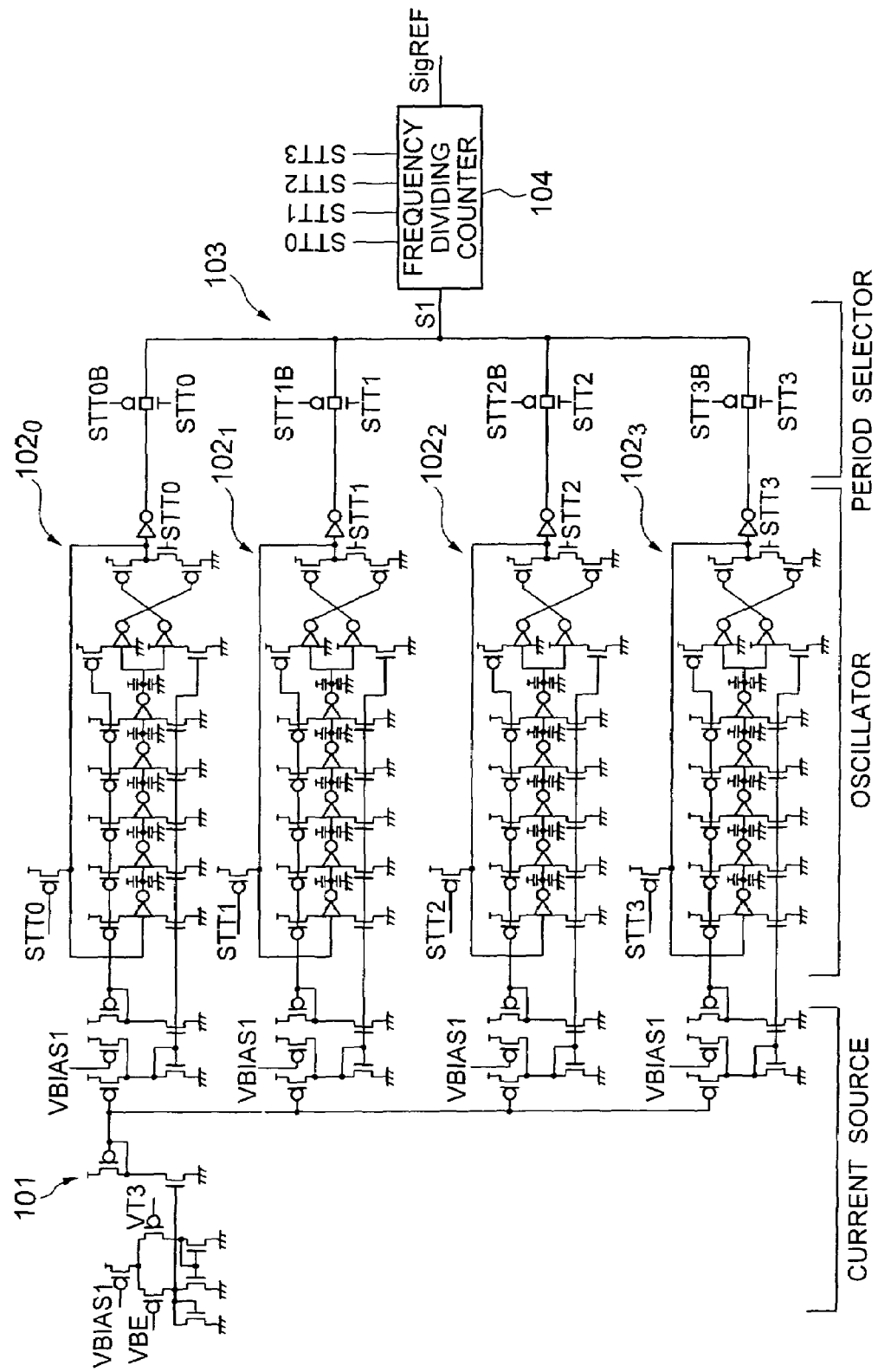
FIG. 4 shows a circuit diagram of a current source, oscillator circuits, and a period selecting circuit.

FIG. 2A shows a circuit diagram of a bias circuit 107 that is used in respective circuits within the oscillator circuit 100, whereas FIG. 2B shows a circuit diagram of a reference voltage generation/level conversion circuit 108. FIG. 3 shows a circuit diagram of the temperature sensor 105, whereas FIG. 4 shows a circuit diagram of the current source 101, oscillators 102, and period selecting circuit 108. The bias circuit 107 shown in FIG. 2A generates a voltage VBIAS0 and a voltage VBIAS1 which are to be used in the current source 101, temperature sensor 105, and reference voltage generation/level conversion circuit 108. The reference voltage generation/level conversion circuit 108 generates voltages VT0 to VT3 which are to be used in the current source 101 and the ambient temperature sensor 105.

As shown in FIG. 3, the temperature sensor 105 includes a first temperature level detection unit 151, a second temperature level detection unit 152, and a third temperature level detection unit 153. The first temperature level detection unit 151 outputs a detection signal ST0 that rises to an H-level when the ambient temperature is higher than 85° C., and falls to an L-level when the ambient temperature is equal to or lower than 85° C. The second temperature level detection unit 152 outputs a detection signal ST1 that rises to an H-level when the ambient temperature is higher than 65° C., and falls to an L-level when the ambient temperature is equal to or lower than 65° C. The third temperature level detection unit 153 outputs a detection signal ST2 that rises to an H-level when the ambient temperature is higher than 45° C., and falls to an L-level when the ambient temperature is equal to or lower than 45° C.

The temperature range signals STT0 to STT3 output from the temperature sensor 105 are such that any one of the temperature range signals is activated based on the detection signals ST0 to ST3. A NAND-1 receives the detection signals ST0, ST1, and ST2, and outputs a NONE of those signals. The NAND-1 activates the temperature range signal STT0 to assume an H-level when all the detection signals ST0 to ST2 assume H-levels, that is, if ambient temperature>85° C. holds. A NAND-2 activates the temperature range signal STT1 to assume an H-level when the detection signal ST0 assumes an L-level and the detection signals ST1 and ST2 assume H-levels, that is, if 65° C.<ambient temperature≦85° C. holds.

A NAND-3 activates the temperature range signal STT2 to assume an H-level when the detection signals ST0 and ST1 assume L-levels and the detection signal ST2 assumes an H-level, that is, 45° C.<ambient temperature≦65° C. A NAND 4 activates the temperature range signal STT3 to assume an H-level when all the detection signals ST0 to ST2 assume L-levels, that is, ambient temperature≦45° C. holds. The oscillators $102_0$ to $102_3$ start for oscillating when corresponding temperature range signals STT0 to STT3 are activated to H-levels.

Figure 5:
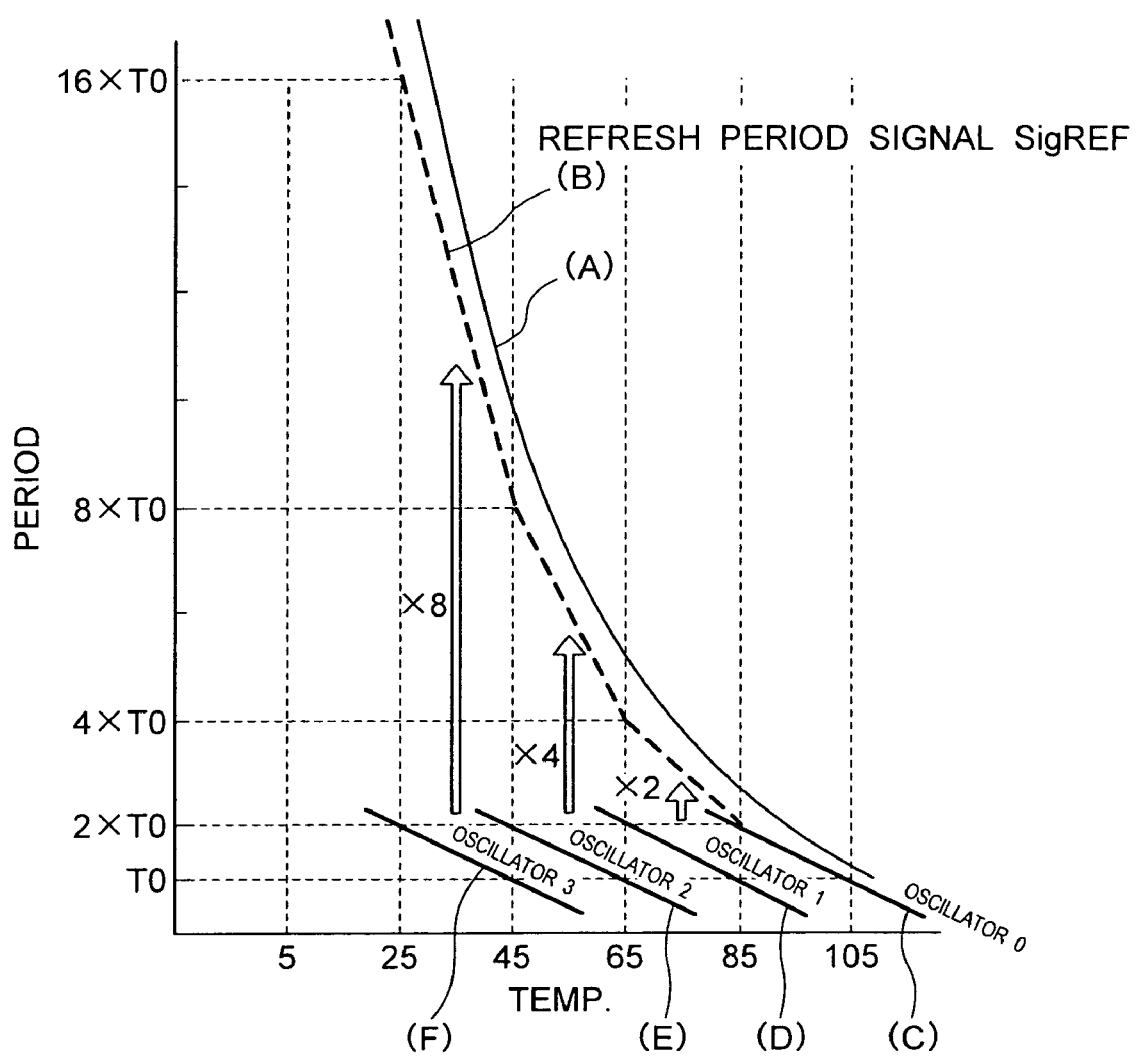
FIG. 5 shows a graphical representation indicative of the relation between a period of an output signal from the oscillator circuit and the ambient temperature.

FIG. 5 shows a graphical representation indicative of the relation between the period of an output signal from the oscillator circuit 100 and the ambient temperature. In FIG. 5, graph (A) indicates the relation between the refresh period required for a DRAM and the ambient temperature, whereas graphs (C) to (F) indicate the relation between the period of output signals of the oscillators $102_0$ to $102_3$ and the ambient temperature. The oscillators $102_0$ to $102_3$ are so configured as to oscillate at the fundamental period T0 when the ambient temperatures are at 105° C., 85° C., 65° C., 45° C., respectively. Furthermore, the oscillators $102_0$ to $102_3$ are so configured as to oscillate at a period which is two times the fundamental period T0 when temperatures are 85° C., 65° C., 45° C., 25° C., respectively.

When the ambient temperature is higher than 85° C. and the temperature range signal STT0 is activated, the period selecting circuit 103 shown in FIG. 4 selects an output from the oscillator $102_0$. The output signal from the oscillator $102_0$ selected by the period selecting circuit 103 is input to the frequency demultiplication circuit 104. The frequency demultiplication circuit 104 sets the frequency dividing ratio at "1" based on the activated temperature range signal STT0, and outputs a refresh period signal SigREF specifying a period equal to that of the output signal from the oscillator $102_0$.

When the ambient temperature is between 65° C. and 85° C. and the temperature range signal STT1 is activated, the period selecting circuit 103 selects an output from the oscillator $102_1$. The frequency demultiplication circuit 104 sets the frequency dividing ratio at "2" based on the activated temperature range signal STT1, and outputs a refresh period signal SigREF specifying a period two times that of the output signal from the oscillator $102_1$. When the ambient temperature is between 45° C. and 65° C. and the temperature range signal STT2 is activated, the period selecting circuit 103 selects an output from the oscillator $102_2$. The frequency demultiplication circuit 104 sets the frequency dividing ratio at "4" based on the activated temperature range signal STT2, and outputs a refresh period signal SigREF specifying a period four times that of the output signal from the oscillator 102 (2).

When the ambient temperature is equal to or lower than 45° C. and the temperature range signal STT3 is activated, the period selecting circuit 103 selects an output from the oscillator $102_3$. The frequency demultiplication circuit 104 sets the frequency dividing ratio at "8" based on the activated temperature range signal STT3, and outputs a refresh period signal SigREF specifying a period eight times that of the output signal from the oscillator $102_3$. During these operations, the refresh period signal SigREF output from the oscillator circuit 100 has its period being changed along with the change of the ambient temperature, as shown by graph (B) in FIG. 5.

According to the present embodiment, with the switching temperature for selecting one of the oscillators 102 by the period selecting circuit 103, the output period of the oscillator 102 before and after the switching is set so that the refresh period signal SigREF changes smoothly, and moreover, the frequency dividing ratio of the frequency demultiplication circuit 104 is set. Thus, the steep change is removed in the profile of period specified by the refresh period signal SigREF. Accordingly, even if the temperature sensed by the temperature sensor 105 fluctuates around the switching temperature, fluctuation of the period of the refresh period signal SigREF can be reduced, which situation is different from the conventional refresh period generation circuit 200 of digital system shown in FIG. 13

Figure 6:
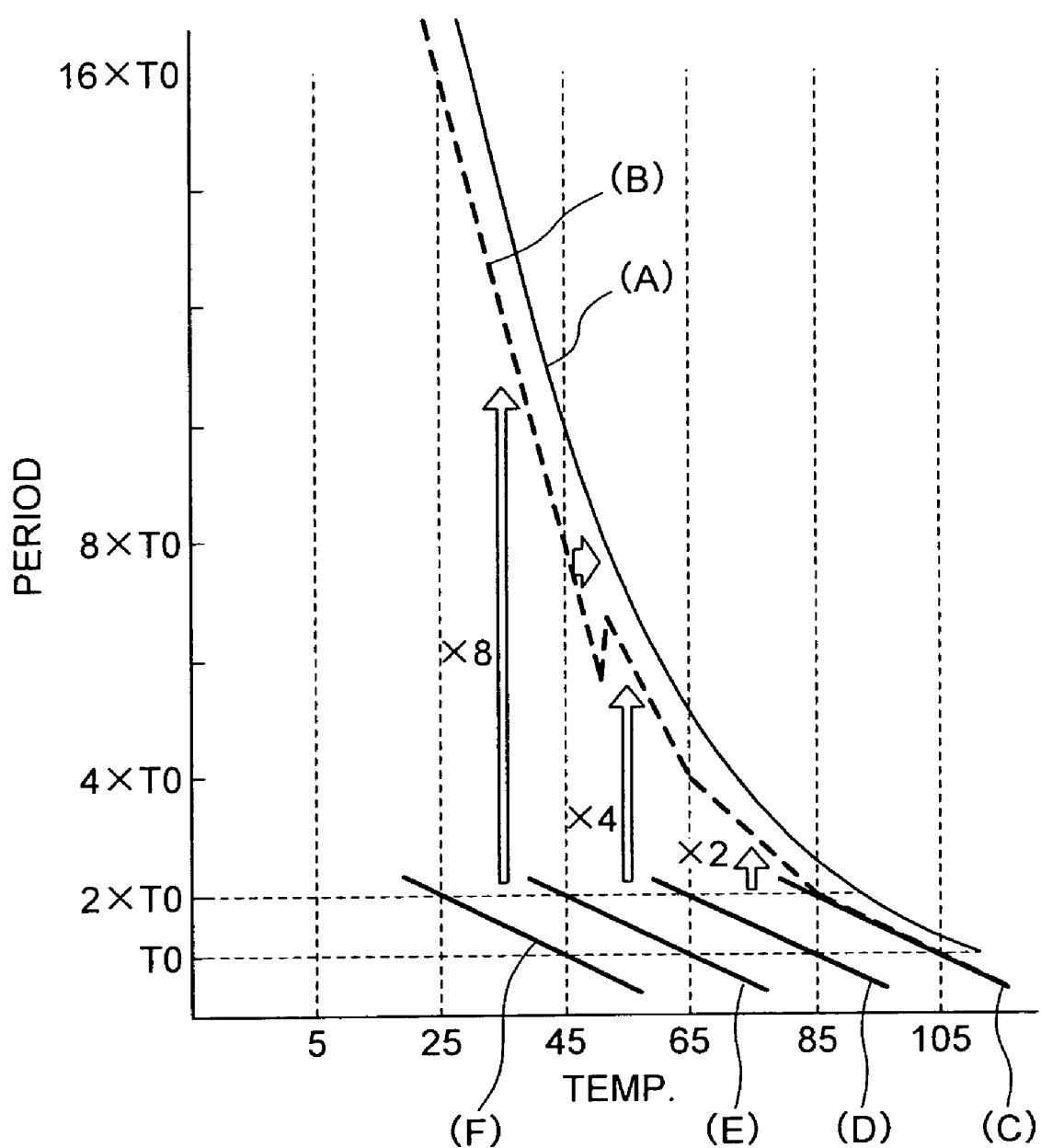
FIG. 6 shows a graphical representation indicative of the relation between a period of an output signal from the oscillator circuit and the ambient temperature in the case where the sensed temperature is shifted to a lower value as compared with the actual temperature.

FIG. 6 shows a graphical representation indicative of the relation between the period of an output signal from the oscillator circuit 100 and the ambient temperature in the case where the sensed temperature is shifted to a lower temperature as compared with the actual temperature. It is assumed here that the temperature sensor 105 senses a temperature equal to or lower than 45° C., for example, when the ambient temperature is actually 50° C. In this case when the ambient temperature rises to 50° C., the oscillator 102 to be selected by the period selecting circuit 103 is switched between the oscillator $102_2$ and the oscillator $102_3$ based on the temperature range signal output from the temperature sensor 105. Upon the actual ambient temperature being at 50° C., the period of an output signal from the oscillator $102_3$ (graph (F)) is shorter than the fundamental period T0. The period equal to eight times that of the output signal from the oscillator $102_3$, which is obtained by the frequency demultiplication circuit 104, is shorter than the period equal to four times that of an output signal from the oscillator $102_2$ at the same temperature, as shown it FIG. 6, and yet is not significantly shorter than the required refresh period.

Figure 7:
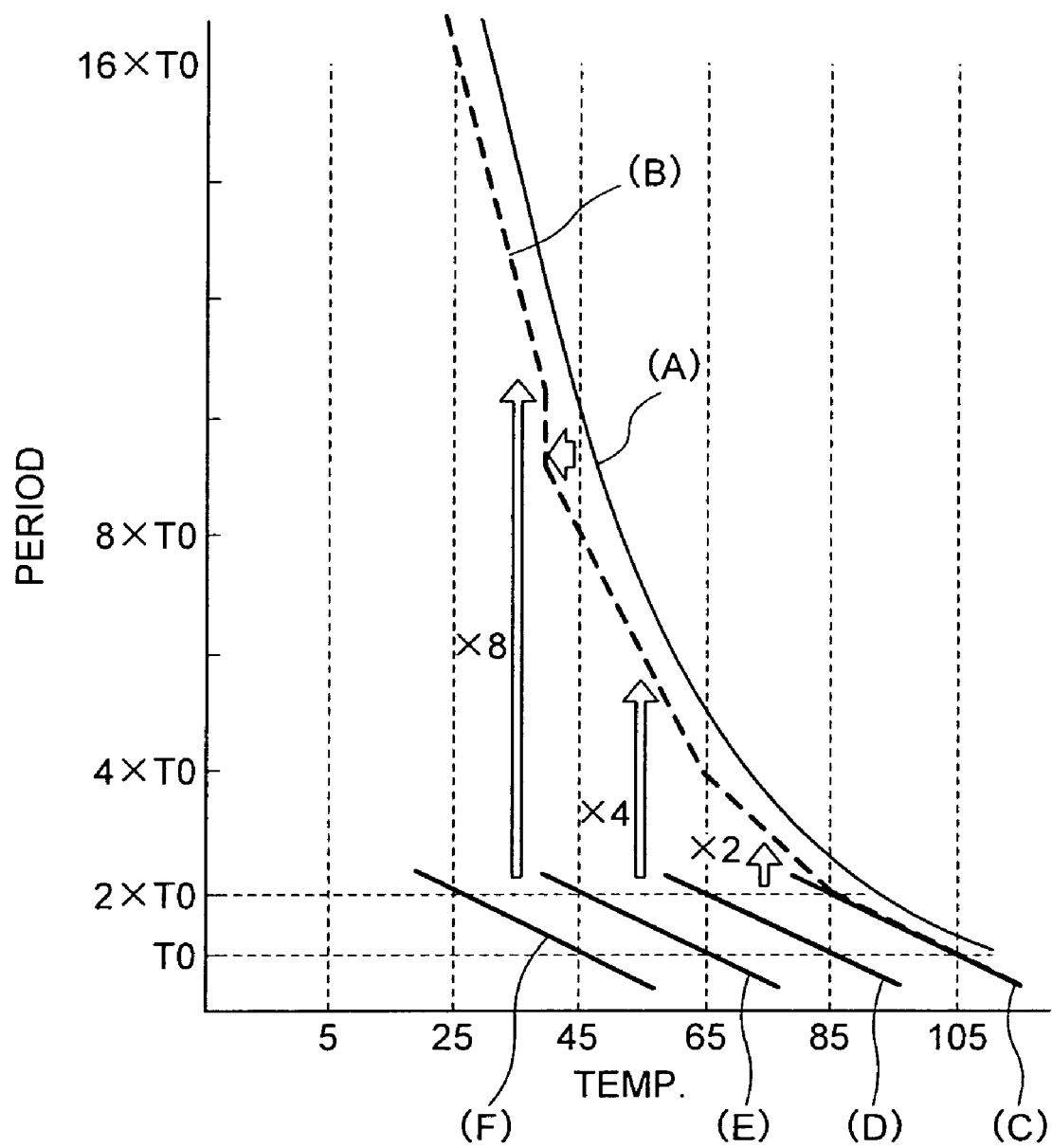
FIG. 7 shows a graphical representation indicative of the relation between a period of an output signal from the oscillator circuit and the ambient temperature in the case where the sensed temperature is shifted to a higher value as compared with the actual temperature.

FIG. 7 shows a graphical representation indicative of the relation between the period of an output signal from the oscillator circuit 100 and the ambient temperature in the case where the sensed temperature is shifted to a higher temperature as compared with actual temperature. As is opposite from the above-described case, for example, it is assumed here that the temperature sensor 105 senses temperature equal to or higher than 45° C. when the ambient temperature is actually 40° C. In this case, when the ambient temperature rises to 40° C., the oscillator 102 to be selected by the period selecting circuit 103 is switched between the oscillator $102_2$ and the oscillator $102_3$. Upon the actual ambient temperature being at 40° C., the period of an output signal from the oscillator $102_2$ (graph (E)) is longer than two times the fundamental period T0. The period equal to four times that of the output signal from the oscillator 102 (2), which is obtained by the frequency demultiplication circuit 104, is shorter than the period equal to eight times that of an output signal from the oscillator $102_3$ at the same temperature, as shown in FIG. 7, and yet is not significantly shorter than the required refresh period.

As described above, according to the present embodiment, even if the sensed temperature is shifted to a lower temperature, since the period of the generated refresh period signal SigREF is short, margin for the required refresh period is not narrow. Furthermore, even if the sensed temperature is shifted to a higher temperature, the refresh period is not excessively short, and does not significantly increase the power dissipation. Thus, employment of the oscillator circuit 100 of the present embodiment reduces the influence caused by fluctuation of the temperature sensed by the temperature sensor 105. Thus, the temperature sensor 105 is not required to sense temperature with a higher accuracy.

Figure 14A:
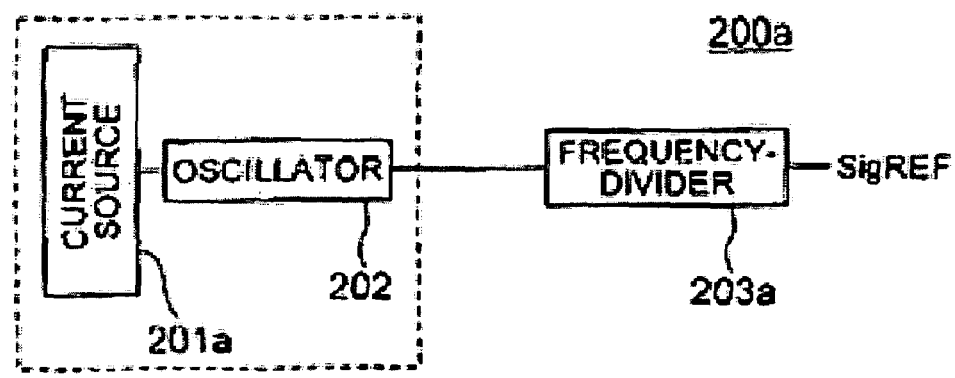
Figure 14B:
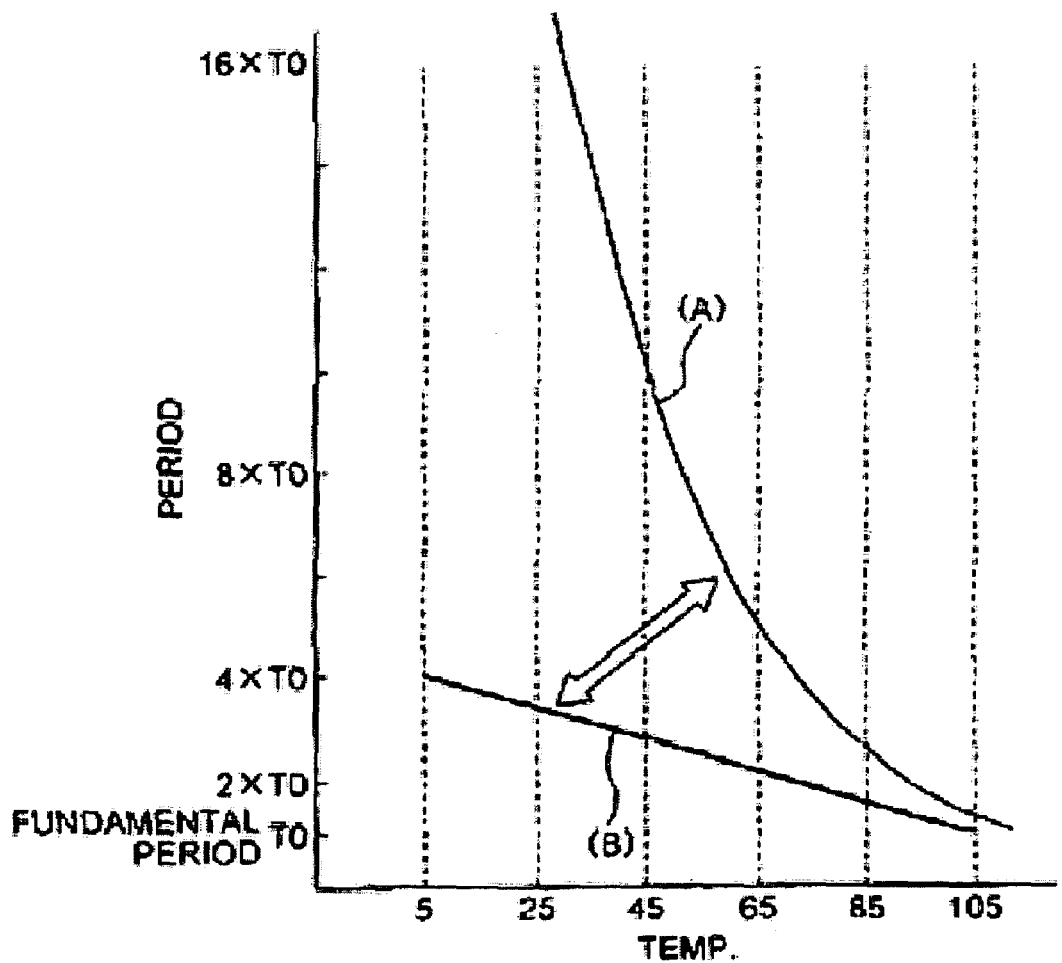
FIG. 14B shows a graphical representation indicative of the relation between the period of an output signal from the refresh period generation circuit and the ambient temperature.

In the present embodiment, as described above, the frequency dividing ratio of the frequency demultiplication circuit 104 used for frequency-demultiplying the period of an output signal from the oscillator 102 is changed depending on the ambient temperature. Thus, the period of the refresh period signal SigREF can be significantly changed by enlarging the frequency dividing ratio of the frequency demultiplication circuit 104 without significantly changing the output period itself of the oscillator 102. Accordingly, the oscillator circuit 100 of the present embodiment can change the period specified by the refresh period signal SigREF widely, substantially without increasing the power dissipation as well as without destabilizing the operation at a lower temperature, which situation is different from the conventional refresh period generation circuit 200a of analog system shown in FIG. 14.

Figure 8:
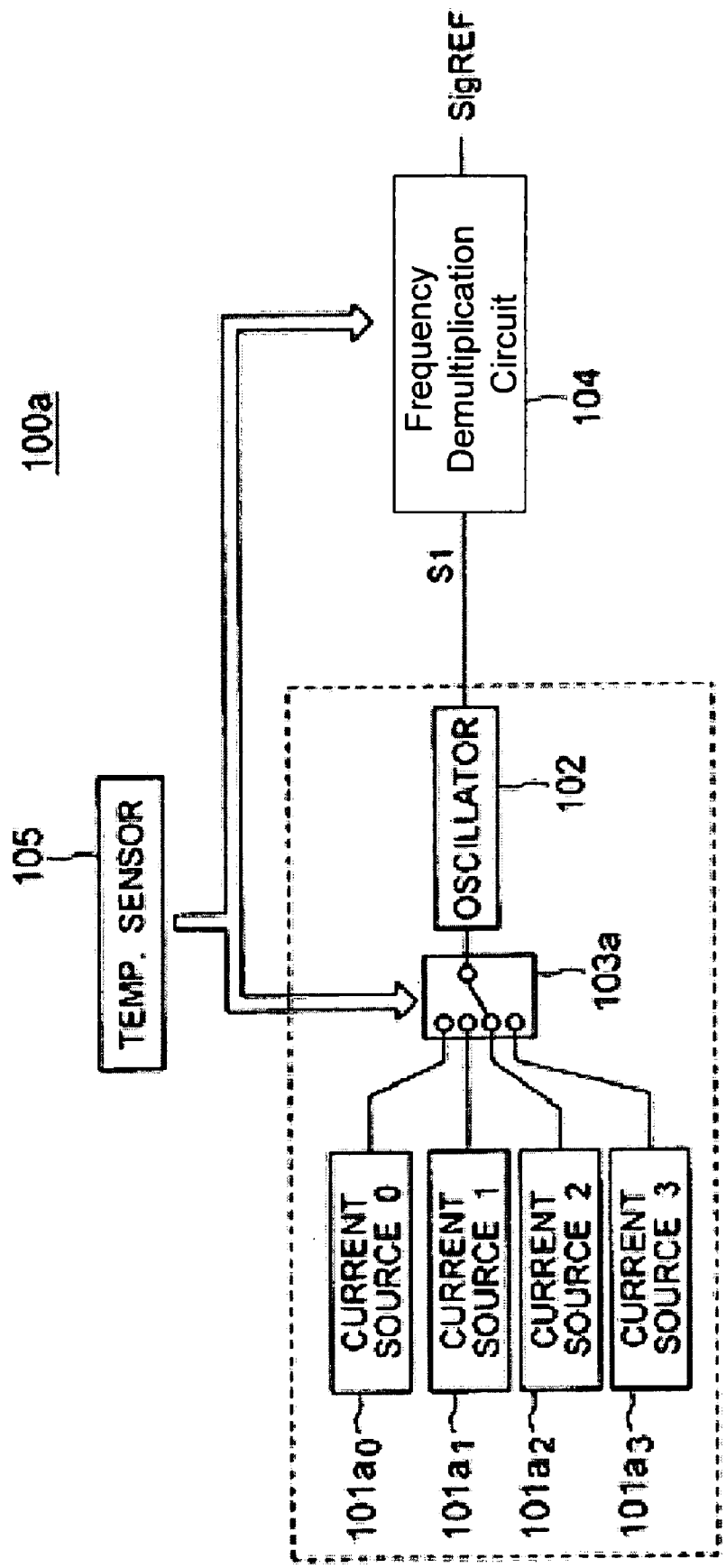
FIG. 8 shows a block diagram of an oscillator circuit according to a second embodiment of the present invention.

FIG. 8 shows a block diagram of an oscillator circuit 100a according to a second embodiment of the present invention. The second embodiment is similar to the first embodiment except that the refresh period signal SigREF specifying a period which changes depending on the ambient temperature is generated using a plurality of current sources $101a_0$ to $101a_3$ and a single oscillator 102.

The current sources $101a_0$ to $101a_3$, a period selecting circuit 103a, and the oscillator 102 in combination configure an oscillation unit. Each of the current sources 101a outputs a current depending on the ambient temperature. The period selecting circuit (current source selection unit) 103a selects one of the plurality of current sources 101a in accordance with the temperature ranges based on the ambient temperature sensed by the temperature sensor 105, and supplies a current generated by the selected current source 101a to the oscillator 102. The relations between the current values of the respective current sources 101a and the ambient temperature are different among the current sources 101a, and the oscillator 102 oscillates at a period based on the current supplied through the period selecting circuit 103a. The frequency demultiplication circuit 104 divides the frequency of an output period from the oscillator 102 by a frequency dividing ratio determined based on the ambient temperature sensed by the temperature sensor 105, and outputs a refresh period signal SigREF.

When the ambient temperature is between 105° C. and 85° C., the current source $101a_0$ generates a current with which the output period of the oscillator 102 changes between the fundamental period T0 and two times the fundamental period T0. Similarly, the current sources $101a_1$ to $101a_3$ generate respective currents with which the output period of the oscillator 102 changes between the fundamental period T0 and two times the fundamental period T0 at the respective temperature ranges. Accordingly, the oscillator 102 oscillates at periods shown by graphs (C) to (F) in FIG. 5 within the respective temperature ranges.

Figure 9:
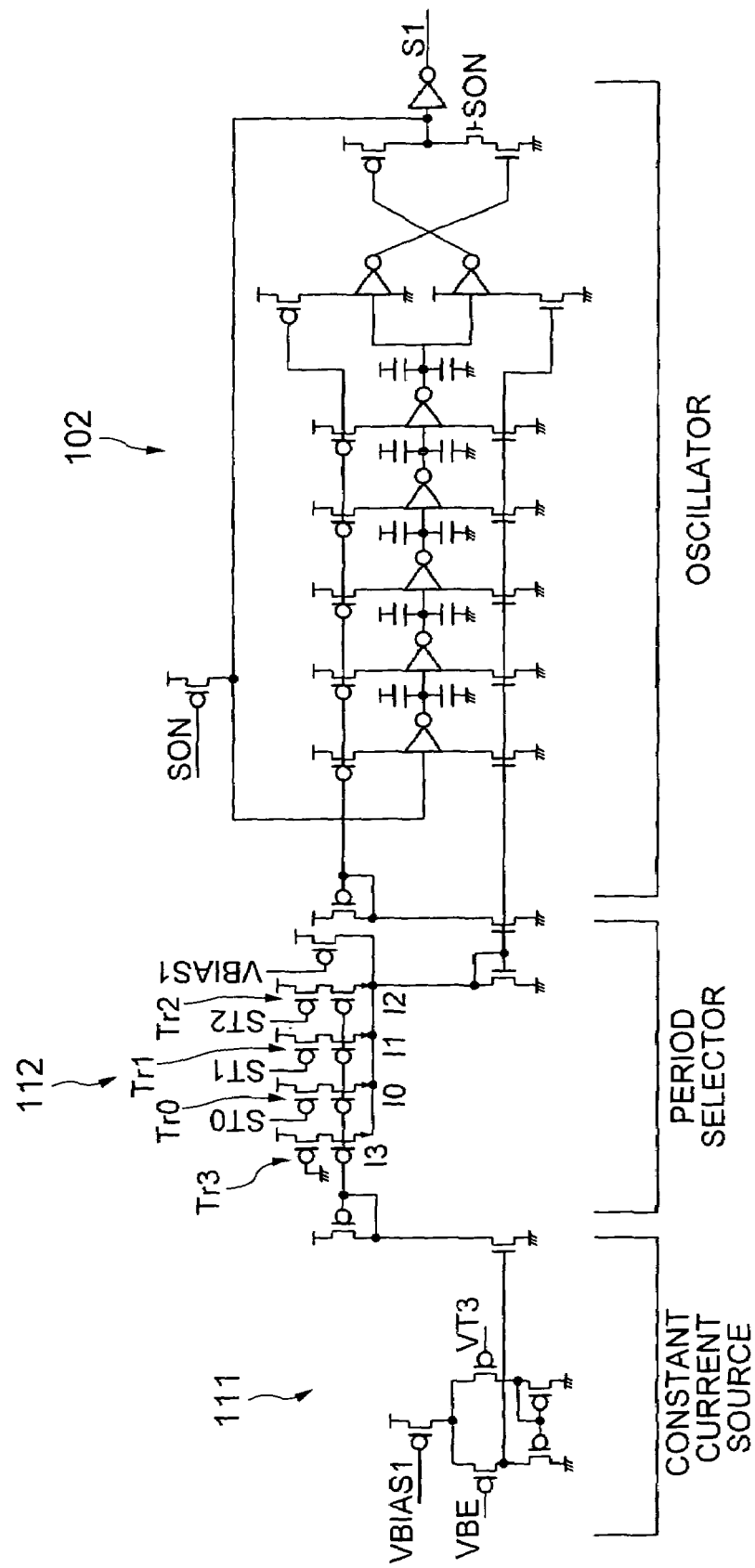
FIG. 9 shows a circuit diagram of current sources, a period selecting circuit, and an oscillator in the second embodiment.

FIG. 9 shows a circuit diagram of the current sources 101a, period selecting circuit 103a, and oscillator 102 of the second embodiment. Each of the current sources $101a_0$ to $101a_3$ and the period selecting circuit 103a shown in FIG. 8 are configured by a constant current unit 111 and a period selecting unit 112, respectively, shown in FIG. 9. The constant current unit 111 is configured as a current source delivering a current value which changes depending on the ambient temperature change. The period selecting unit 112 has transistors Tr0 to Tr3. The period selecting unit 112 receives a current generated by the constant current unit 111, and changes the value of the current to be supplied to the oscillator 102 based on the detection signals ST0 to ST3 delivered from the temperature sensor 105 shown in FIG. 3.

When the ambient temperature is higher than 85° C., in the temperature sensor 105 shown in FIG. 3, the first temperature level detection unit 151, second temperature level detection unit 152, and third temperature level detection unit 153 output the detection signals ST0 to ST3, respectively, which assume H-levels. In the period selecting unit 112, of the transistors Tr0 to Tr3, the transistor Tr3 alone having a gate which is grounded is turned on, and a current corresponding to the current (I3) flowing through the transistor Tr3 is supplied to the oscillator 102. Since the value of the current generated by the constant current unit 111 is lowered as the ambient temperature falls, the current I3 is lowered in accordance with the temperature fall, and the oscillation period of the oscillator 102 is elongated as the ambient temperature falls.

When the ambient temperature falls to satisfy the relation 65° C.<ambient temperature≦85° C., the detection signal ST0 is changed from an H-level to an L-level. In the period selecting unit 112, in addition to the transistor Tr3, the transistor Tr0 having a gate which receives the detection signal ST0 is turned on, and a current corresponding to the total current (I0+I3) flowing through the transistors Tr0 and Tr3 is supplied to the oscillator 102. Since the current supplied to the oscillator 102 is increased by a current corresponding to the current I0, the oscillator 102 oscillates at a period which is shorter than the oscillation period at the ambient temperature slightly exceeding 85° C.

When the ambient temperature falls to satisfy the relation 45° C.<ambient temperature≦65° C., the detection signal ST1 is also changed from H-level to L-level. In the period selecting unit 112, in addition to the transistors Tr0 and Tr3, the transistor Tr1 having a gate which receives the detection signal ST1 is also turned on, and a current corresponding to the total current (I0+I1+I3) flowing through the transistors Tr0, Tr1, and Tr3 is supplied to the oscillator 102. The oscillator 102 oscillates at a period which is shorter than the oscillation period at the ambient temperature slightly exceeding 65° C.

When the ambient temperature further falls to be equal to or lower than 45° C., the detection signal ST2 is also changed from an H-level to an L-level. In the period selecting unit 112, all the four transistors Tr0 to Tr3 are on, and a current corresponding to the total current (I0+I1+I2+I3) flowing through the transistors Tr0 to Tr3 is supplied to the oscillator 102. The oscillator 102 oscillates at a period which is shorter than the oscillation period at the ambient temperature slightly exceeding 45° C.

In the second embodiment, as described above, the refresh period signal SigREF is generated using the single oscillator 102 and the plurality of current sources 101a. With this configuration, the refresh period signal SigREF having a temperature dependency similar to that in the first embodiment can be generated In the second embodiment, since a plurality of oscillators 102 are not required, the circuit configuration can be simplified as compared with that of the first embodiment. Other advantages are similar to those of the first embodiment.

Figure 10:
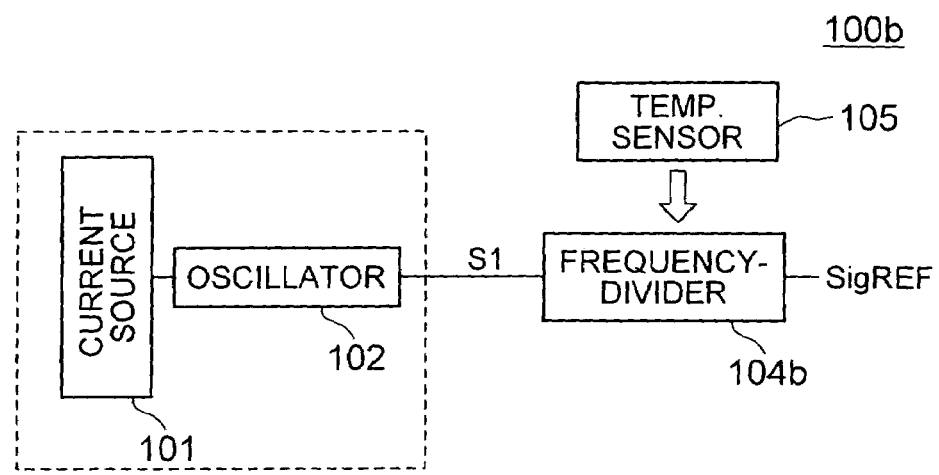
FIG. 10 shows a block diagram of an oscillator circuit according to a third embodiment of the present invention.

FIG. 10 shows a block diagram of an oscillator circuit 100b according to a third embodiment of the present invention. In the third embodiment, the refresh period signal SigREF having a period which changes depending on the ambient temperature is generated using a single current source 101 having a temperature dependency and a single oscillator 102. In the first embodiment, the frequency demultiplication circuit 104 sets the frequency dividing ratio at "1", "2", "4" . . . based on the ambient temperatures sensed by the temperature sensor 105, whereas in the third embodiment, the frequency demultiplication circuit 104b sets the frequency dividing ratio at "1", "2", "3" . . . based on the ambient temperatures sensed by the temperature sensor 105.

Figure 11:
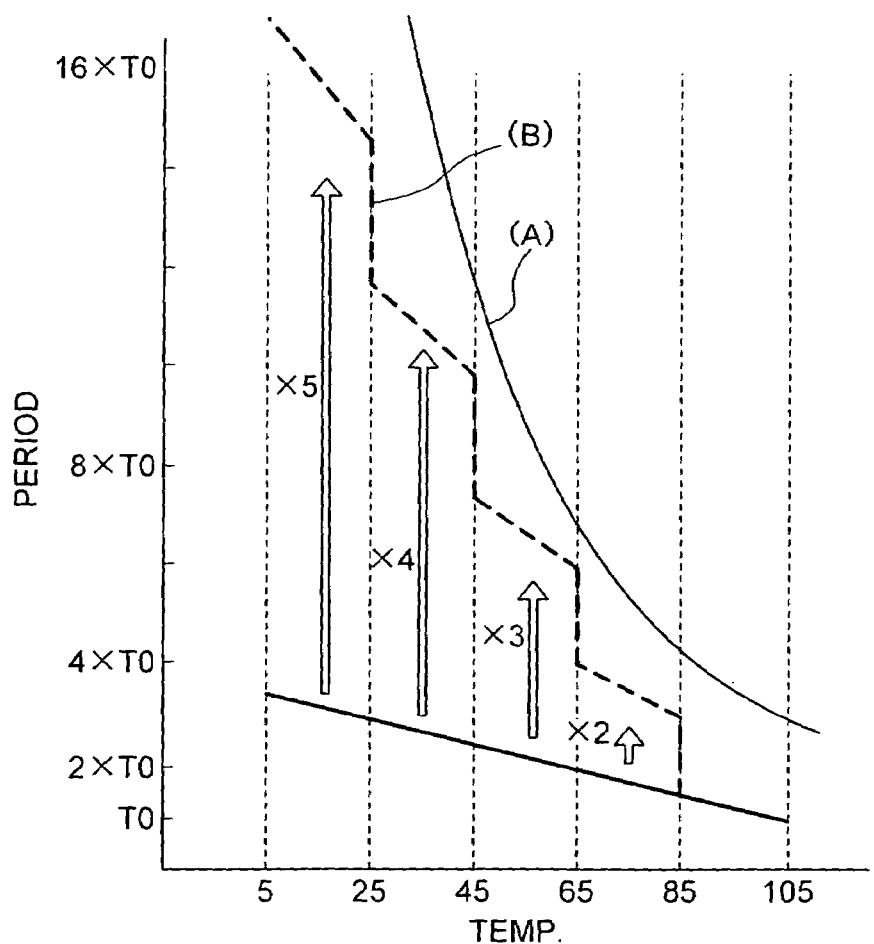
FIG. 11 shows a graphical representation indicative of the relation between the period of a refresh period signal SigREF generated by the oscillator circuit shown in FIG. 10 and the ambient temperature.

FIG. 11 shows a graphical representation indicative of the relation between the period of a refresh period signal SigREF generated by the oscillator circuit 100b shown in FIG. 10 and the ambient temperature. The oscillator 102 oscillates at the fundamental period T0 when the ambient temperature is 105° C., and oscillates at a period three times the fundamental period T0 when the ambient temperature is 5° C., corresponding to the current value supplied from the current source 101 having a temperature dependency. When the temperature sensor 105 detects that the ambient temperature is higher than 85° C., the frequency demultiplication circuit 104b sets the frequency dividing ratio at "1", and outputs a refresh period signal SigREF specifying a period equal to that of the output signal from the oscillator 102.

When the temperature sensor 105 detects that the ambient temperature is between 65° C. and 85° C., the frequency demultiplication circuit 104b sets the frequency dividing ratio at "2", and outputs a refresh period signal SigREF specifying a period two times that of the output signal from the oscillator 102. When the temperature sensor 105 detects that the ambient temperature is between 45° C. an 65° C., the frequency demultiplication circuit 104b sets the frequency dividing ratio at "3", and outputs a refresh period signal SigREF specifying a period three times that of the output signal from the oscillator 102.

When the temperature sensor 105 detects that the ambient temperature is between 25° C. and 45° C., the frequency demultiplication circuit 104b sets the frequency dividing ratio at "4", and outputs a refresh period signal SigREF specifying a period four times that of the output signal from the oscillator 102. When the temperature sensor 105 detects that the ambient temperature is between 5° C. and 25° C., the frequency demultiplication circuit 104b sets the frequency dividing ratio at "5", and outputs a refresh period signal SigREF specifying a period five times that of the output signal from the oscillator 102. During these operations, a refresh period signal SigREF can be obtained having a period which changes along with the change of the ambient temperature, as shown by graph (B).

Figure 13A:
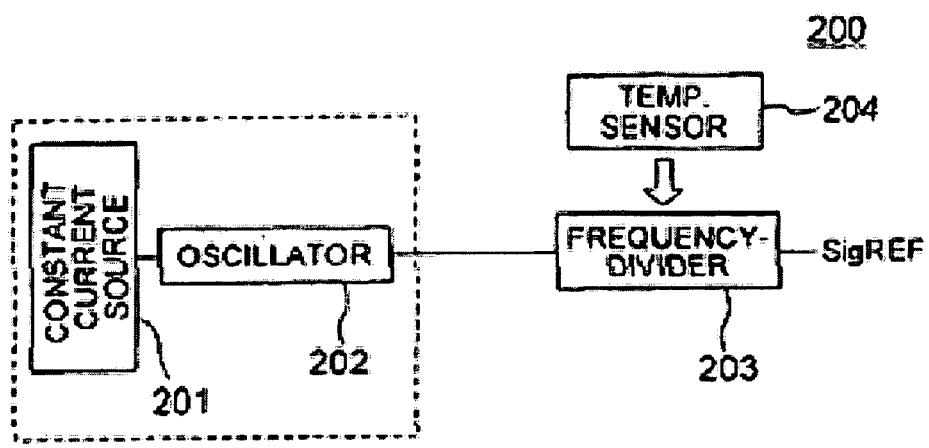
Figure 13B:
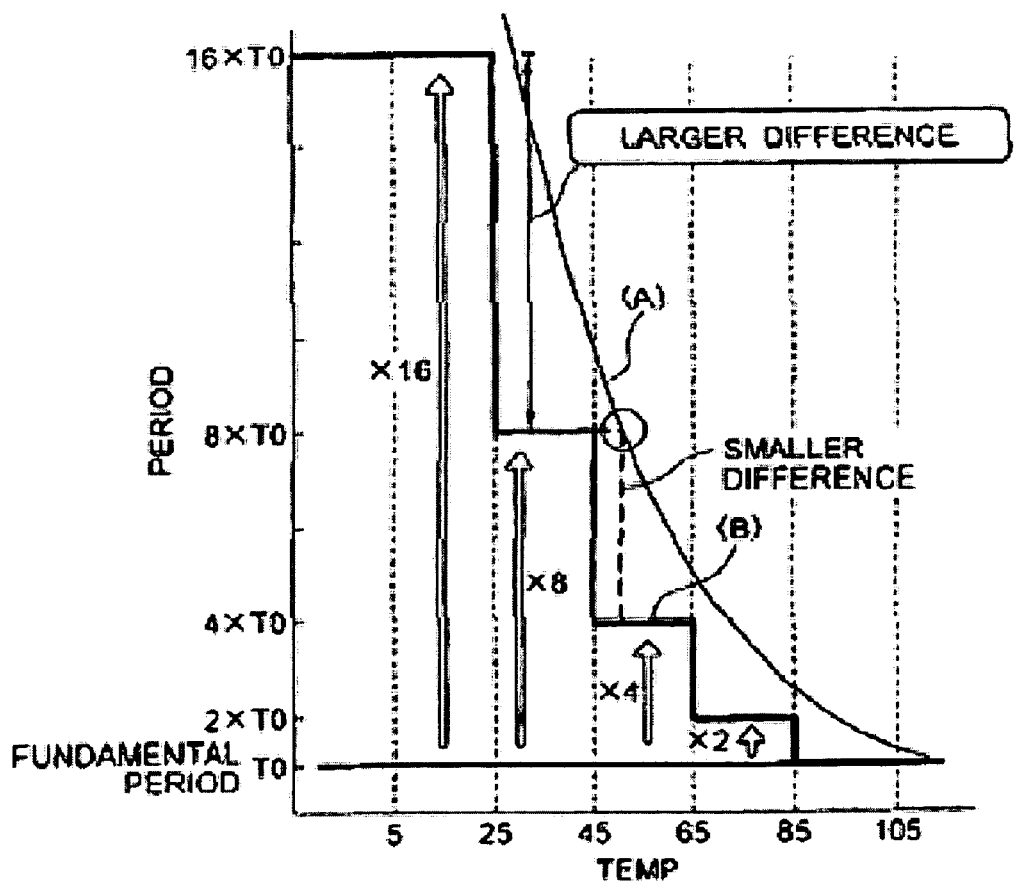
FIG. 13B shows a graphical representation indicative of the relation between the period of an output signal of the refresh period generation circuit and the ambient temperature.

According to the third embodiment, since the current source 101 is used delivering a current value which changes depending on the ambient temperature, the steep change is removed in the profile of the period of the refresh period signal SigREF at the boundary between adjacent temperature ranges or at the switching of the frequency dividing ratio in the frequency demultiplication circuit 104b, which situation is different from the conventional refresh period generation circuit 200 of digital system shown in FIG. 13. Even if the temperature sensed by the temperature sensor 105 is shifted to a higher temperature, margin for the required period is increased. In the third embodiment, the frequency dividing ratio of the frequency demultiplication circuit 104b is increased along with the fall of the temperature sensed by the temperature sensor 105. Accordingly, the period of the refresh period signal SigREF can be changed widely in the range exceeding one digit of the period, with the change of the current value of the current source 101 being suppressed for the temperature change, which situation is different from the conventional refresh period generation circuit 200a of analog system shown in FIG. 14.

It is to be noted that in the first embodiment, within the respective temperature ranges, the period of an output signal from the oscillator 102 is changed between the fundamental period T0 and two times the fundamental period T0; however, the present invention is not restricted to this configuration. As for the frequency dividing ratio of the frequency demultiplication circuit 104, it is assumed here that the change ratio of the period of the oscillator 102 (ratio of an oscillation period when the ambient temperature is lowest in the temperature range to an oscillation period when the ambient temperature is highest in the temperature range) is set at N. In this case, by setting the frequency dividing ratio within the subject temperature range to be 1/N times the frequency dividing ratio of the frequency demultiplication circuit within an adjacent lower temperature range, the steep change can be removed in the profile of period specified by the refresh period signal SigREF at the boundary between the adjacent temperature ranges.

Figure 12:
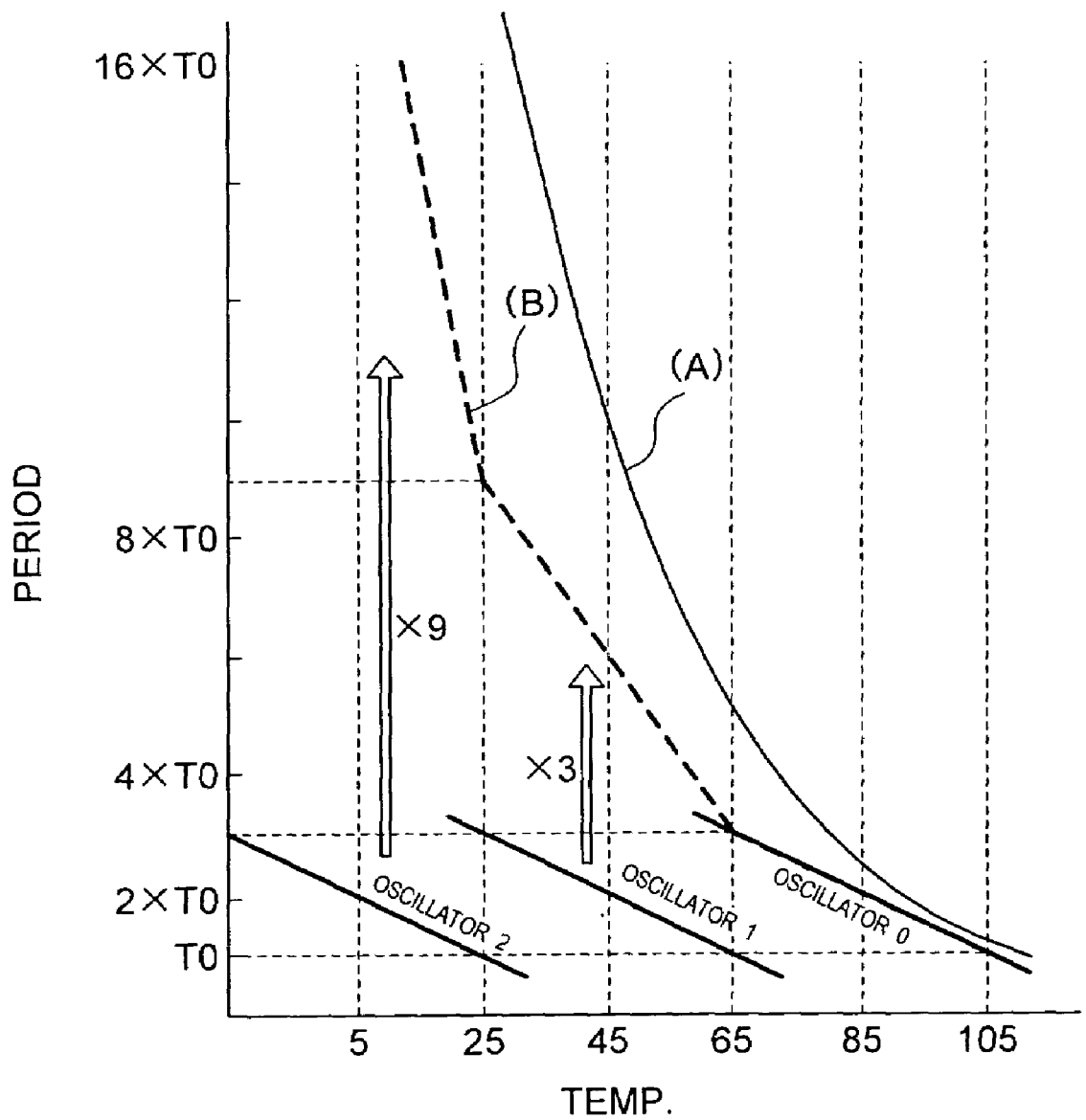
FIG. 12 shows a graphical representation indicative of an example in which, within respective temperature ranges, the period of an output signal from the oscillator changes between a fundamental period T0 and three times the fundamental period T0.

FIG. 12 shows a graphical representation indicative of an example in which, within the respective temperature ranges, the output period of the oscillator 102 is changed between the fundamental period T0 and three times the fundamental period T0. In this case, as shown in FIG. 12, by setting the frequency dividing ratio of the frequency demultiplication circuit 104 at "1", "3", and "9" in this order from a higher temperature range to a lower temperature range, the steep change can be removed in the profile of period specified by the refresh period signal SigREF (graph (B)) at the boundary between the temperature ranges.

In the above-described embodiments, the oscillation period of the oscillator 102 is multiplied or frequency-divided in the frequency demultiplication circuit 104. On the other hand, another frequency demultiplication circuit (period multiplication circuit) that multiplies the oscillation period of the oscillator 102 by predetermined times may be arranged at the upstream or downstream of the frequency demultiplication circuit 104. For example, in FIG. 1, another period multiplication circuit for coarsely adjusting the period of a signal to be supplied to the frequency demultiplication circuit 104 may be arranged between the period selecting circuit 103 and the frequency demultiplication circuit 104. The another period multiplication circuit multiplies the period of a signal output from the period selecting circuit 103 by two times or three times to supply the resultant signal to the frequency demultiplication circuit 104.

While the present invention has been described in accordance with preferred embodiments thereof illustrated in the accompanying drawings and described in the above description in detail, it should be noted by those ordinarily skilled in the art that the present invention is not limited to the embodiments, and various modifications, alternative constructions or equivalents can be implemented without departing from the scope and spirit of the present invention as set forth and defined by the appended claims.

What is claimed is:

1. An oscillator circuit comprising an oscillation unit generating an output signal, said output signal oscillates at a period depending on an ambient temperature, said period shorter at a higher ambient temperature; a temperature sensor that detects said ambient temperature; and, a frequency demultiplication circuit that divides a frequency of said output signal from said oscillation unit by a frequency dividing ratio selected from a plurality of frequency dividing ratios;

wherein said frequency demultiplication circuit selects a smaller one of said frequency dividing ratios for the higher ambient temperature being detected by said temperature sensor.

2. The oscillator circuit according to claim 1, wherein said oscillation unit comprises a current source for generating a current that increases upon a rise of said ambient temperature.

3. An oscillator circuit comprising an oscillation unit generating an output signal, said output signal oscillates at a period depending on an ambient temperature; a temperature sensor that detects said ambient temperature; and, a frequency demultiplication circuit that divides a frequency of said output signal from said oscillation unit by a frequency dividing ratio selected from a plurality of frequency dividing ratios;

wherein said frequency demultiplication circuit selects a smaller one of said frequency dividing ratios for a higher ambient temperature being detected by said temperature sensor; and, wherein said oscillation unit includes a current source for generating a current that increases upon a rise of said ambient temperature, a plurality of oscillators for oscillating at respective periods, which depend on a current generated by said current source, and based on different relations between said ambient temperature and said oscillation periods, and an oscillator selection unit that selects one of said plurality of oscillators depending on a detected ambient temperature detected by said temperature sensor.

4. The oscillator circuit according to claim 3 further comprising a temperature range detection unit for detecting a temperature range among a plurality of temperature ranges based on said detected ambient temperature, wherein said selection of said frequency dividing ratio by said frequency demultiplication circuit and said selection of said oscillator by said oscillator selection unit are controlled depending on a temperature range detected by said temperature range detection unit.

5. The oscillator circuit according to claim 4, wherein, assuming that a change ratio of said output period of said oscillation unit within one of said temperature ranges is N, said frequency dividing ratio within said one of said temperature ranges corresponds to 1/N times said frequency dividing ratio within an adjacent lower temperature range.

6. An oscillator circuit comprising an oscillation unit generating an output signal, said output signal oscillates at a period depending on an ambient temnerature; a temperature sensor that detects said ambient temperature; and, a frequency demultiplication circuit that divides a frequency of said output signal from said oscillation unit by a frequency dividing ratio selected from a plurality of frequency dividing ratios;

wherein said frequency demultiplication circuit selects a smaller one of said frequency dividing ratios for a higher ambient temperature being detected by said temperature sensor; and, wherein said oscillation unit includes a plurality of current sources for generating currents, which increase upon a rise of said ambient temperature, based on different relations between said ambient temperature and values of said currents, a current source selection unit that selects one of said plurality of current sources depending on a detected ambient temperature detected by said temperature sensor, and an oscillator that oscillates at a period depending on a current of said one of said current sources selected by said current source selection unit.

7. The oscillator circuit according to claim 6, further comprising a level detection unit for detecting a temperature level among a plurality of temperature levels based on said detected ambient temperature, wherein said selection of said frequency dividing ratio by said frequency demultiplication circuit and said selection of said current source by said current source selection unit are controlled depending on a temperature range detected by said temperature range detection unit.

8. The oscillator circuit according to claim 7, wherein, assuming that a change ratio of said output period of said oscillation unit within one of said temperature ranges is N, said frequency dividing ratio within said one of said temperature, ranges corresponds to 1/N times said frequency dividing ratio within an adjacent lower temperature range.

* * * * *